United States Patent
Qin et al.

(10) Patent No.: US 9,244,752 B2
(45) Date of Patent: Jan. 26, 2016

(54) SYSTEMS AND METHODS FOR DETECTING MEDIA FLAWS

(71) Applicant: LSI Corporation, San Jose, CA (US)

(72) Inventors: Dahua Qin, Allentown, PA (US); Xun Zhang, Westford, MA (US); Haitao Xia, San Jose, CA (US)

(73) Assignee: Avago Technologies General IP (Singapore) Pte. Ltd.

( * ) Notice: Subject to any disclaimer, the term of this patent is extended or adjusted under 35 U.S.C. 154(b) by 285 days.

(21) Appl. No.: 13/912,109

(22) Filed: Jun. 6, 2013

(65) Prior Publication Data

US 2014/0331108 A1    Nov. 6, 2014

Related U.S. Application Data

(60) Provisional application No. 61/818,840, filed on May 2, 2013.

(51) Int. Cl.
*H03M 13/03* (2006.01)
*G06F 11/07* (2006.01)

(52) U.S. Cl.
CPC ............ *G06F 11/0727* (2013.01); *H03M 13/03* (2013.01)

(58) Field of Classification Search
CPC .............. G06F 11/0727; H03M 13/41; H03M 13/2957
See application file for complete search history.

(56) References Cited

U.S. PATENT DOCUMENTS

| | | | |
|---|---|---|---|
| 5,202,903 A * | 4/1993 | Okanoue | 375/347 |
| 5,247,254 A * | 9/1993 | Huber et al. | 324/212 |
| 5,802,069 A | 9/1998 | Coulson | |
| 6,065,149 A | 5/2000 | Yamanaka | |
| 6,216,249 B1 * | 4/2001 | Bliss et al. | 714/792 |
| 6,292,317 B1 * | 9/2001 | Alexander | 360/31 |
| 6,301,679 B1 | 10/2001 | Tan | |
| 6,446,236 B1 | 9/2002 | McEwen et al. | |
| 6,557,113 B1 | 4/2003 | Wallentine | |
| 6,691,263 B2 | 2/2004 | Vasic et al. | |
| 6,697,977 B2 | 2/2004 | Ozaki | |
| 6,731,442 B2 | 5/2004 | Jin et al. | |
| 6,738,948 B2 | 5/2004 | Dinc et al. | |
| 6,865,223 B1 * | 3/2005 | Pham et al. | 375/229 |

(Continued)

FOREIGN PATENT DOCUMENTS

| | | |
|---|---|---|
| EP | 0549151 | 6/1993 |
| EP | 1096491 | 10/2005 |

(Continued)

OTHER PUBLICATIONS

Bagul "Assessment of current health and remaining useful life of hard disk drives" [online] Jan. 1, 2009 [ret. Oct. 14, 2010] Ret. from internet:<URL;http://iris.lib.neu.edu.

(Continued)

*Primary Examiner* — Esaw Abraham

(57) ABSTRACT

An apparatus for detecting media flaws includes a branch metric selection circuit operable to select a first branch metric and a second branch metric, a subtraction circuit operable to subtract the second branch metric from the first branch metric to yield a difference, and a comparator operable to compare the difference with a threshold value and to indicate a presence of a potential flaw in a storage medium when the difference is less than the threshold value.

20 Claims, 4 Drawing Sheets

(56) References Cited

U.S. PATENT DOCUMENTS

| | | | |
|---|---|---|---|
| 6,980,382 B2 | 12/2005 | Hirano et al. | |
| 7,032,127 B1* | 4/2006 | Egan et al. | 714/6.13 |
| 7,154,936 B2 | 12/2006 | Bjerke et al. | |
| 7,168,030 B2 | 1/2007 | Ariyoshi | |
| 7,203,015 B2 | 4/2007 | Sakai et al. | |
| 7,237,173 B2 | 6/2007 | Morita et al. | |
| 7,254,192 B2 | 8/2007 | Onggosanusi et al. | |
| 7,257,066 B2* | 8/2007 | Fujiwara et al. | 369/53.15 |
| 7,257,172 B2 | 8/2007 | Okamoto et al. | |
| 7,359,313 B2 | 4/2008 | Chan et al. | |
| 7,441,174 B2 | 10/2008 | Li et al. | |
| 7,457,212 B2 | 11/2008 | Oh | |
| 7,561,642 B2* | 7/2009 | Adachi | 375/341 |
| 7,652,966 B2 | 1/2010 | Kadokawa | |
| 7,688,915 B2 | 3/2010 | Tanrikulu et al. | |
| 7,702,973 B2 | 4/2010 | Mead et al. | |
| 7,849,385 B2 | 12/2010 | Tan et al. | |
| 7,852,722 B2 | 12/2010 | Kikugawa et al. | |
| 7,924,518 B2 | 4/2011 | Mathew et al. | |
| 7,952,824 B2 | 5/2011 | Dziak et al. | |
| 8,014,094 B1* | 9/2011 | Jin | 360/31 |
| 8,095,855 B2 | 1/2012 | Tan | |
| 8,121,224 B2 | 2/2012 | Tan | |
| 8,139,457 B2 | 3/2012 | Cao | |
| 8,149,527 B2 | 4/2012 | Tan | |
| 8,161,357 B2 | 4/2012 | Tan | |
| 8,176,400 B2 | 5/2012 | Tan | |
| 8,190,831 B2 | 5/2012 | Lee et al. | |
| 8,201,051 B2 | 6/2012 | Tan | |
| 8,219,892 B2 | 7/2012 | Tan | |
| 2003/0043487 A1 | 3/2003 | Morita et al. | |
| 2005/0268210 A1* | 12/2005 | Ashley et al. | 714/792 |
| 2007/0061687 A1 | 3/2007 | Hwang | |
| 2010/0042877 A1 | 2/2010 | Tan | |
| 2010/0229031 A1 | 9/2010 | Tan | |
| 2010/0268996 A1 | 10/2010 | Yang | |
| 2010/0269023 A1 | 10/2010 | Yang | |
| 2011/0167323 A1* | 7/2011 | Yu et al. | 714/795 |
| 2011/0205653 A1 | 8/2011 | Mathew | |
| 2011/0209026 A1 | 8/2011 | Xia | |
| 2012/0087033 A1 | 4/2012 | Yang | |
| 2012/0254679 A1 | 10/2012 | Tan | |
| 2012/0266055 A1 | 10/2012 | Zhang | |

FOREIGN PATENT DOCUMENTS

| | | |
|---|---|---|
| JP | 10-145243 | 5/1998 |
| JP | 2007-087529 | 4/2007 |
| WO | WO 01/39188 | 5/2001 |

OTHER PUBLICATIONS

ECMA: Standardizing Information and Communication Systems: "Standard ECMA-272: 120 mm DVD Rewritable Disk (DVD-RAM)" Standard ECMA, No. 272, pp. 43-51, (Feb. 1998).

Galbraith et al, "Iterative Detection Read Channel Technology in Hard Disk Drives" [online] Oct. 1, 2008 Ret. from Internet<URL:http://www.hitachigst.com.

Kavcic et al., "A Signal-Dependent Autoregressive Channel Model", IEEE Transactions on Magnetics, vol. 35, No. 5, Sep. 1999 pp. 2316-2318.

U.S. Appl. No. 13/558,228, filed Jul. 25, 2012, Weijun Tan, Unpublished.

U.S. Appl. No. 13/547,516, filed Jul. 12, 2012, Jefferson E. Singleton, Unpublished.

U.S. Appl. No. 13/551,523, filed Jul. 17, 2012, Ming Jin, Unpublished.

U.S. Appl. No. 13/561,243, filed Jul. 30, 2012, Fan Zhang, Unpublished.

U.S. Appl. No. 13/654,417, filed Oct. 18, 2012, Fan Zhang, Unpublished.

U.S. Appl. No. 13/525,194, filed Jun. 15, 2012, Bruce Wilson, Unpublished.

U.S. Appl. No. 13/452,722, filed Apr. 20, 2012, Shaohua Yang, Unpublished.

U.S. Appl. No. 13/459,289, filed Apr. 30, 2012, Fan Zhang, Unpublished.

U.S. Appl. No. 13/213,789, filed Aug. 19, 2011, Ming Jin, Unpublished.

U.S. Appl. No. 13/368,599, filed Feb. 8, 2012, Yang Cao, Unpublished.

* cited by examiner

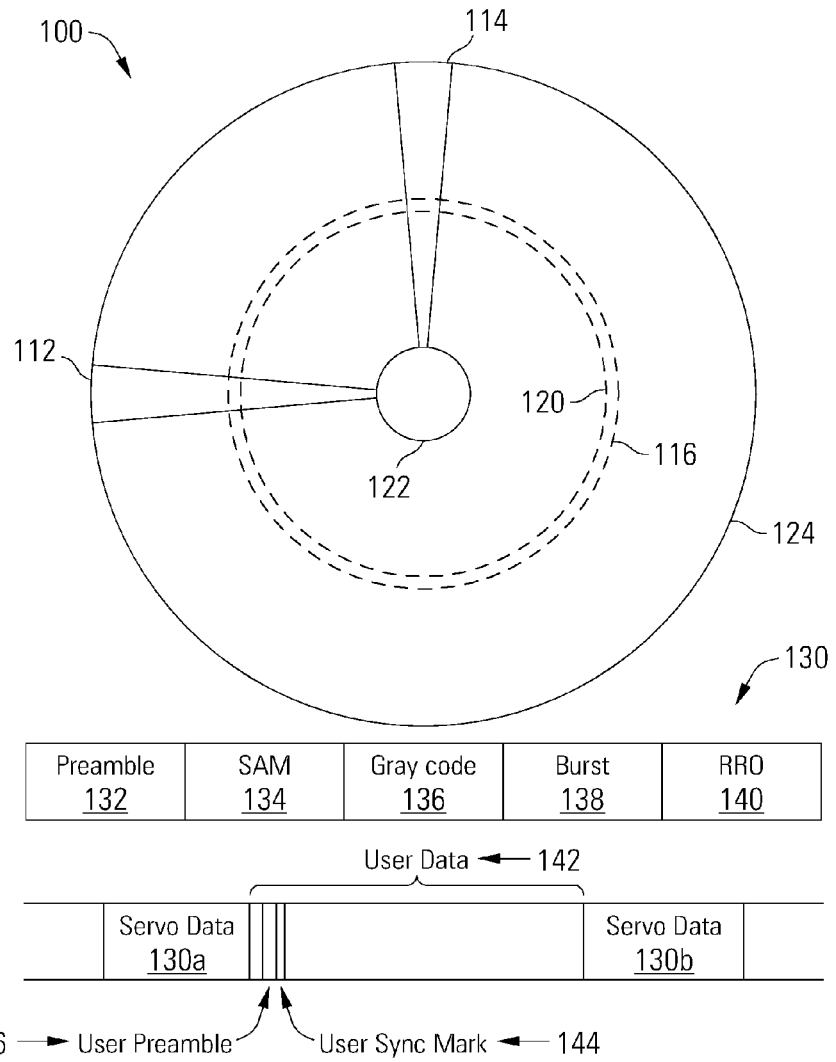
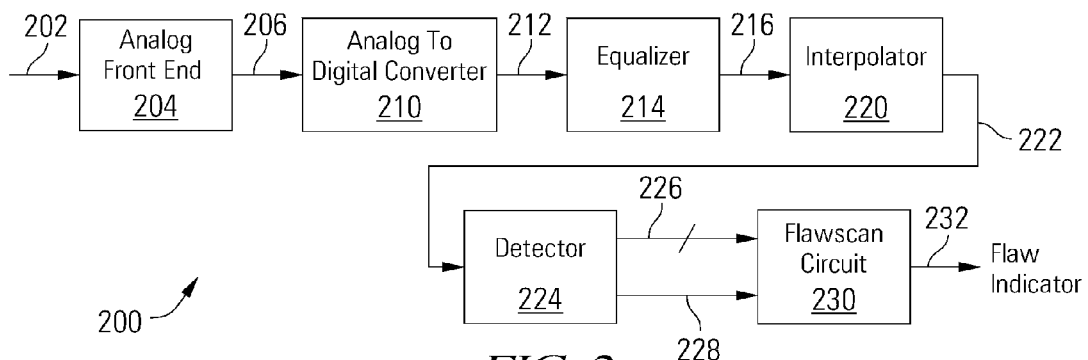
FIG. 1
FIG. 2

SYSTEMS AND METHODS FOR DETECTING MEDIA FLAWS

CROSS REFERENCE TO RELATED APPLICATIONS

The present application claims priority to (is a non-provisional of) U.S. Pat. App. No. 61/818,840, entitled "Systems and Methods for Detecting Media Flaws", and filed May 2, 2013 by Qin et al, the entirety of which is incorporated herein by reference for all purposes.

FIELD OF THE INVENTION

Various embodiments of the present invention provide systems and methods for detecting media flaws, and more particularly to systems and methods for performing flaw scan based on a Viterbi detector.

BACKGROUND

In a typical magnetic storage system, digital data is stored in a series of concentric circular tracks along a storage medium. Data is written to the medium by positioning a read/write head assembly over the medium at a selected location as the storage medium is rotated, and subsequently passing a modulated electric current through the head assembly such that a corresponding magnetic flux pattern is induced in the storage medium. To retrieve the stored data, the head assembly is positioned anew over the track as the storage medium is rotated. In this position, the previously stored magnetic flux pattern induces a current in the head assembly that can be converted to the previously recorded digital data.

Flawscan is a typically a factory process to detect defects on the surface of a magnetic storage medium. A signal is written to the disk and is read back and analyzed by an analog read channel system to detect flaws, based on the amplitude of the signal as it is read back.

BRIEF SUMMARY

Embodiments of the present invention provide systems and methods for performing flaw scan to detect surface errors on storage media using a digital data detector in a data processing system.

An apparatus for detecting media flaws includes a branch metric selection circuit operable to select a first branch metric and a second branch metric, a subtraction circuit operable to subtract the second branch metric from the first branch metric to yield a difference, and a comparator operable to compare the difference with a threshold value and to indicate a presence of a potential flaw in a storage medium when the difference is less than the threshold value.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 is a block diagram of a magnetic storage medium and sector data scheme that may be scanned for flaws with a flawscan circuit based on detector branch metrics;

FIG. 2 depicts a block diagram of a servo channel with a flawscan circuit based on detector branch metrics in accordance with some embodiments of the present invention;

DETAILED DESCRIPTION OF THE INVENTION

Figure 3:
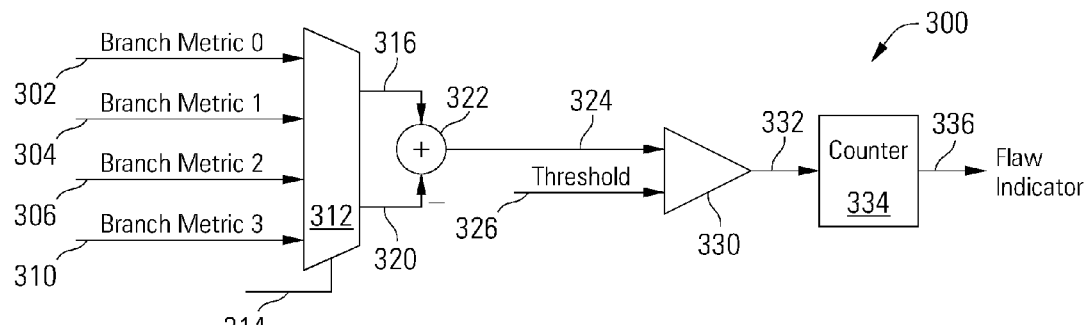
FIG. 3 depicts a block diagram of a flawscan circuit based on detector branch metrics in accordance with some embodiments of the present invention.

Embodiments of the present invention are related to detecting defects or flaws on a storage medium such as a magnetic hard disk platter, based on branch metrics from a digital data detector such as a Viterbi detector. Selected branch metrics from the data detector are correlated with characteristics of the flaws in incoming waveforms. The flawscan circuit enables detection of flaws that have characteristics such as, but not limited to, width, depth and starting position with respect to the data magnetically recorded on a disk platter. The flawscan detector based on branch metrics from a digital data detector can be used in a servo channel circuit to detect flaws in a servo region of a disk platter, as well as in other data processing systems to detect flaws in other regions of a storage medium. The flaw indicator generated by the flawscan detector is an effective indication of defects on the storage medium, substantially independent of data pattern and signal amplitude.

Turning to FIG. 1, a magnetic storage medium 100 with servo wedges (e.g., 112, 114) containing servo data is depicted in accordance with one or more embodiments of the present invention. Two exemplary data tracks 116, 120 are shown, indicated as dashed lines. The tracks 116, 120 are segregated by servo data written within wedges 112, 114.

The servo wedges 112, 114 may extend from an inner diameter 122 to an outer diameter 124, each with a single wedge shape, and with the width increasing all the way from inner diameter 122 to outer diameter 124, or the shape of each wedge may be adjusted to avoid becoming too wide at outer diameter 124. Servo wedges 112, 114 may have any suitable shape and arrangement, and any number of servo wedges may be provided on storage medium 100. It should be noted that while two tracks 116, 120 and two servo wedges 112, 114 are shown, hundreds of wedges and tens of thousands of tracks may be included on a given storage medium.

The servo wedges 112, 114 include servo data 130 that is used for control and synchronization of a read/write head assembly over a desired location on storage medium 100. In particular, the servo data 130 generally includes a preamble pattern 132 followed by a servo address mark 134, followed by a Gray code 136, a burst field 138, and a repeatable run-out (RRO) field 140. Between the servo data bit patterns 130a and 130b, a user data region 142 is provided. User data region 142 may include one or more sets of data that are stored to storage medium 100. The data sets may include user synchronization information some of which may be used as a mark to establish a point of reference from which processing of the data within user data region 142 may begin processing.

In operation, storage medium 100 is rotated in relation to a sensor that senses information from the storage medium. In a read operation, the sensor would sense servo data from wedge 112 (i.e., during a servo data period) followed by user data from a user data region between wedge 112 and wedge 114 (i.e., during a user data period) and then servo data from wedge 114. In a write operation, the sensor would sense servo data from wedge 112 then write data to the user data region between wedge 112 and wedge 114, with location information in the user data region provided by a user sync mark 144 and a user preamble 146. The signal from the sensor is processed by a data detector, and branch metrics from the data detector that are used in detecting data values are provided to the flawscan detector. The flawscan detector analyzes the branch metrics to detect flaws on the storage medium 100.

In some embodiments, the flawscan detector based on branch metrics from a digital data detector is incorporated in a servo channel circuit to detect flaws in any region of the servo wedges 112, 114. In other embodiments, the flawscan detector based on branch metrics from a digital data detector differentiates between flaws in various servo regions, such as, but not limited to, regions containing the preamble pattern 132, regions containing the servo address mark 134, and regions containing the Gray code 136. In yet other embodiments, the flawscan detector can be incorporated in a read channel circuit to detect flaws in regions containing user data 142.

Turning to FIG. 2, a block diagram depicts a servo channel 200 with a flawscan detector 230 based on branch metrics 226 from a digital data detector 224 in accordance with some embodiments of the present invention. The flawscan detector 230 is used to detect flaws in a servo region of a storage medium, independent of the amplitude or data pattern of an analog input signal 202, and to yield a flaw indicator signal 232 providing a count of the potential flaws that were detected. The user may respond in any suitable manner to detected flaws, such as marking flawed regions of the storage medium as unusable, discarding the storage medium, etc.

Servo channel 200 includes an analog front end circuit 204 that receives an analog signal 202. Analog signal 202 may be, but is not limited to, a minute analog electrical signal derived from a read/write head assembly (not shown) that is disposed in relation to a storage medium (not shown). Based upon the disclosure provided herein, one of ordinary skill in the art will recognize a variety of sources from which analog input 202 may be derived. Analog front end circuit 204 processes analog signal 202 and provides a processed analog signal 206 to an analog to digital converter circuit 210. Analog front end circuit 204 may include, but is not limited to, an analog filter and an amplifier circuit as are known in the art. Based upon the disclosure provided herein, one of ordinary skill in the art will recognize a variety of circuitry that may be included as part of analog front end circuit 204.

Analog to digital converter circuit 210 converts processed analog signal 206 into a corresponding series of digital samples 212. Analog to digital converter circuit 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer circuit 214. Equalizer circuit 214 applies an equalization algorithm to digital samples 212 to yield an equalized output 216. In some embodiments of the present invention, equalizer circuit 214 is a digital finite impulse response filter circuit as are known in the art. Equalizer circuit 214 ensures that equalized output 216 have the desired spectrum for data detector 224.

The equalized output 216 is provided to an interpolator 220, which performs timing and tracking functions to remove radial incoherence in equalized output 216 and yielding interpolated output 222. The interpolator 220 may include one interpolation circuit or a bank of interpolation circuits operating at different phase offsets, interpolating between samples in equalized output 216 to overcome the quick phase changes and signal loss associated with radial incoherence. Interpolator 220 interpolates between samples in the equalized output 216 to yield time-aligned samples in interpolated output 222 in order to align the received samples from analog signal 202 with the expected samples or Y ideals. Based upon the disclosure provided herein, one of ordinary skill in the art will recognize a variety of interpolation architectures and/or other numbers of interpolator circuits and phase offsets that may be used in relation to different embodiments of the present invention.

The interpolated output 222 is provided to data detector 224 which applies a data detection algorithm to interpolated output 222 to detect the correct values of data bits or symbols in interpolated output 222. Data detector 224 may be any data detector circuit known in the art that is capable of producing a detected output using branch metric values 226 that can be provided to flawscan detector 230. In some embodiments of the present invention, data detector 224 is a Viterbi algorithm data detector circuit as are known in the art. In other embodiments of the present invention, data detector 224 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, a Viterbi detection algorithm or Viterbi algorithm detector circuit that operates on wide bi-phase encoded user data. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In addition to branch metrics 226, data detector 224 also yields a detected output 228 indicating the detected value of data bits in interpolated output 222.

Branch metrics 226 and detected output 228 from data detector 224 are provided to flawscan detector 230, which selects among the branch metrics 226 based on the detected output 228, processes the selected branch metrics 226 to detect flaws on a storage medium from which the analog signal 202 was read or derived, and which yields a flaw indicator signal 232. In some embodiments, flaw indicator signal 232 is a count of the number of potential flaws detected by flawscan detector 230. In other embodiments, flaw indicator signal 232 is a digital signal asserted when a flaw is detected, or indicating that a flaw has been detected, or that the number of potential flaws detected exceeds a threshold. The flawscan detector 230 operates based on the branch metrics 226 generated during detection by data detector 224 and is substantially independent of the amplitude or data pattern of analog signal 202. Rather, the flawscan detector 230 analyzes the difference between branch metric values for various decision paths between possible data states, such as, but not limited to, the difference between the branch metric value of the path between two detected data values and the branch metric value of the path from a detected data value to an inverse of detected data value.

Turning to FIG. 3, a flawscan circuit 300 based on detector branch metrics 302, 304, 306, 310 is shown in accordance with some embodiments of the present invention. In some embodiments, branch metrics 302-310 are Euclidean distances between interpolator output (e.g., 222) and y ideal values, generated by a data detector during a data detection algorithm. For a two state data detector in which a data value is either a 0 or 1, four branch metric values are generated between two successive processing or clock cycles. The four branch metric values correspond to the branch from data bit 0 in a previous cycle to data bit 0 in a current cycle, from the branch from data bit 0 in a previous cycle to data bit 1 in a current cycle, from the branch from data bit 1 in a previous cycle to data bit 0 in a current cycle, and from the branch from data bit 1 in a previous cycle to data bit 1 in a current cycle. Notably, the flawscan circuit 300 is not limited to use with a two-state data detector that provides four branch metrics, and other embodiments select between other numbers of branch metric inputs to yield a pair of branch metrics to compare and analyze.

The branch metrics 302-310 are provided to a four to two multiplexer 312 that accepts as inputs the four branch metrics 302-310 and yields two branch metric outputs 316, 320 based on a selector signal 314. Again, in other embodiments, other numbers of branch metric inputs are provided to the multiplexer to select a pair of branch metric outputs.

The selector signal 314 selects two of the branch metrics 302-310 to be compared and analyzed to detect flaws in a storage medium. In some embodiments, the first branch metric output 316 carries the branch metric value for a branch between a detected data bit and a subsequent inverse of detected data bit, and the second branch metric output 320 carries the branch metric value for a branch between two successive detected data bits. In other embodiments, other pairs of branch metric values are selected.

In some embodiments, the selector signal 314 carries the two user data bits from the previous and current processing cycles in the detected output (e.g., 228) from the data detector (e.g., 224). In these embodiments, the multiplexer 312 is adapted to output at first branch metric output 316 the branch metric for the branch between the states corresponding to the detected value of user data of previous cycle and inverse of the detected value of user data of current cycle at selector signal 314, and to output at second branch metric output 320 the branch metric for the branch between the states corresponding to the detected values of user data of previous and current cycles at selector signal 314. In another embodiment, the two detected output bits are evaluated in a selector generator circuit (not shown) to generate a selector signal to control the multiplexer 312 to yield the same result as in the previous embodiments, but with another format for the selector signal 314.

The second branch metric output 320 is subtracted from the first branch metric output 316 in subtraction circuit 322, yielding difference 324. The difference 324 is compared with a threshold 326 in comparator circuit 330, yielding comparison 332 which is asserted when difference 324 is less than threshold 326. In some embodiments, threshold 326 is user programmable to set the level at which a branch metric difference indicates a potential flaw in the storage medium. The comparison 332 is provided to a counter 334 which keeps a count of the number of potential flaws detected in the storage medium. When the difference 324 is less than the threshold 326, the counter 334 is incremented. The count from counter 334 is provided as a flaw indicator output 336.

Figure 4:
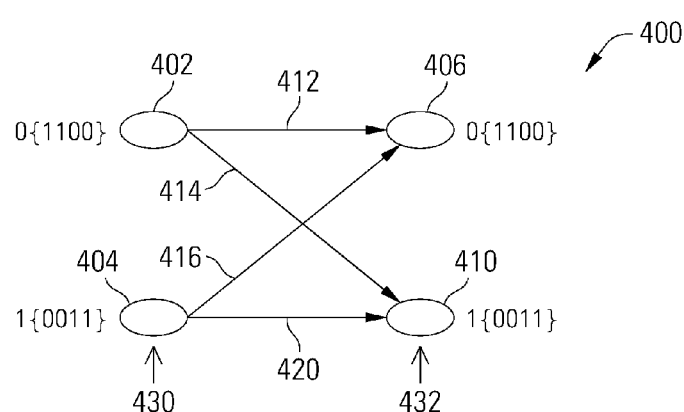
FIG. 4 depicts a partial trellis diagram for a data detector illustrating branch metrics used by a flawscan circuit in accordance with some embodiments of the present invention.

Turning to FIG. 4, a partial trellis diagram for a data detector is shown, illustrating the branch metrics used by a flawscan circuit in accordance with some embodiments of the present invention. Each column in the trellis diagram includes the possible data values at a given processing cycle, with states 430 for a previous cycle shown at the left of FIG. 4 and states 432 for a current cycle shown at the right of FIG. 4. During the previous cycle, a user data bit can have either a value of 0 in state 402 or 1 in state 404. During the current cycle, the user data bit can have either a value of 0 in state 406 or 1 in state 410.

In some embodiments, user data is encoded to write four bits to the storage medium for each user data bit, writing data pattern {0011} to the storage medium for user data bit 0 and data pattern {1100} for user data bit 1. Thus, FIG. 4 is a simplified trellis diagram showing decision branches between states for user data bits, and omitting the branches and states for servo channel data patterns that do not correspond to a user data bit value, such as, but not limited to, {0010} which may arise due to noise in the servo channel.

States in the simplified trellis diagram of FIG. 4 are referred to herein either as a "decision state" (e.g., 404, 406) for which the detector has arrived at a decision and which are likely to hold a correct value, or a "non-decision state" (or error state) for which the detector has not arrived at a decision. Branches between decision states are referred to herein as a "decision branch". Branches from a non-decision state to a decision state are referred to herein as a "to branch". Branches from a decision state to a non-decision state are referred to herein as a "from branch". Thus, if decision state 404 and decision state 406 are states which the detector has decided are likely correct, in other words, if user data bits in the previous and current cycle actually have value "10", branch 416 from decision state 404 to decision state 406 is a "decision branch", branch 412 from non-decision state 402 to correct decision state 406 is a "to branch", and branch 420 from decision state 404 to non-decision state 410 is a "from branch".

The flawscan circuit in some embodiments calculates the difference between the branch metric for the "from branch" (e.g., 420) and the branch metric for the "decision branch" (e.g., 416). In these embodiments, the branch metric for the "to branch" (e.g., 412) and for branches between non-decision states (e.g., branch 414) are discarded and ignored. Again, in the example embodiment disclosed above, the "from branch" is the branch from the non-decision state (e.g., 402), or the state in which all four servo channel bits may be incorrect, to the decision state (e.g., 406), or the state in which the detector has decided that all four servo channel bits are correct. However, the flawscan detector based on branch metrics is not limited to the selection of branch metrics used in the example embodiments disclosed herein, but may be adapted to use branch metrics for other decision branches, including branches not shown in the simplified trellis diagram of FIG. 4 such as states in which some but not all of the servo channel bits are correct (e.g., {0010}).

Figure 5:
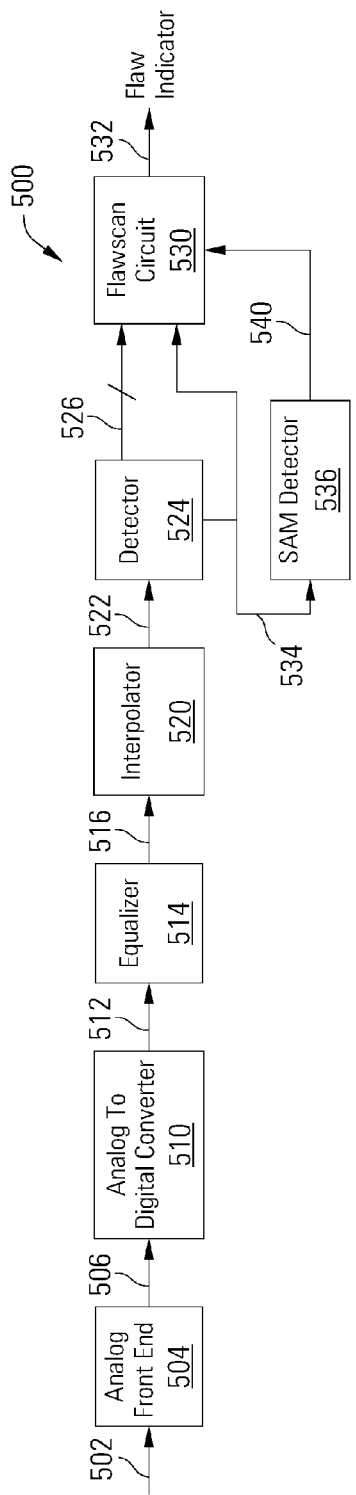
FIG. 5 depicts a block diagram of a servo channel with a flawscan circuit based on detector branch metrics with servo address mark region differentiation in accordance with some embodiments of the present invention.

Turning to FIG. 5, a servo channel 500 is depicted with a flawscan circuit 530 based on detector branch metrics with servo address mark region differentiation in accordance with some embodiments of the present invention. In this embodiment, flaw detection is differentiated by the servo region. In other words, potential flaws are counted by the flawscan circuit 530 for each of a number of different servo regions, where the servo regions are detected by a servo address mark detector circuit 536.

Servo channel 500 includes an analog front end circuit 504 that receives an analog signal 502. Analog signal 502 may be, but is not limited to, a minute analog electrical signal derived from a read/write head assembly (not shown) that is disposed in relation to a storage medium (not shown). Based upon the disclosure provided herein, one of ordinary skill in the art will recognize a variety of sources from which analog input 502 may be derived. Analog front end circuit 504 processes analog signal 502 and provides a processed analog signal 506 to an analog to digital converter circuit 510. Analog front end circuit 504 may include, but is not limited to, an analog filter and an amplifier circuit as are known in the art. Based upon the disclosure provided herein, one of ordinary skill in the art will recognize a variety of circuitry that may be included as part of analog front end circuit 504.

Analog to digital converter circuit 510 converts processed analog signal 506 into a corresponding series of digital samples 512. Analog to digital converter circuit 510 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 512 are provided to an equalizer circuit 514. Equalizer circuit 514 applies an equalization algorithm to digital samples 512 to yield an equalized output 516. In some embodiments of the present invention, equalizer circuit 514 is a digital finite impulse response filter circuit as are known in the art. Equalizer circuit 514 ensures that equalized output 516 have the desired spectrum for data detector 524.

The equalized output 516 is provided to an interpolator 520, which performs timing and tracking functions to remove radial incoherence in equalized output 516 and yielding interpolated output 522. The interpolator 520 may include one interpolation circuit or a bank of interpolation circuits operating at different phase offsets, interpolating between samples in equalized output 516 to overcome the quick phase changes and signal loss associated with radial incoherence. Based upon the disclosure provided herein, one of ordinary skill in the art will recognize a variety of interpolation architectures and/or other numbers of interpolator circuits and phase offsets that may be used in relation to different embodiments of the present invention.

The interpolated output 522 is provided to data detector 524 which applies a data detection algorithm to interpolated output 522 to detect the correct values of data bits or symbols in interpolated output 522. Data detector 524 may be any data detector circuit known in the art that is capable of producing a detected output using branch metric values 526 that can be provided to flawscan detector 530. In some embodiments of the present invention, data detector 524 is a Viterbi algorithm data detector circuit as are known in the art. In other embodiments of the present invention, data detector 524 is a maximum a posteriori data detector circuit as are known in the art. Based upon the disclosure provided herein, one of ordinary skill in the art will recognize a variety of data detector circuits that may be used in relation to different embodiments of the present invention. In addition to branch metrics 526, data detector 524 also yields a detected output 534 indicating the detected value of data bits in interpolated output 522.

Detected output 534 is provided to a servo address mark detector circuit 536 which detects servo address marks in the detected output 534 to identify the current servo region of the data in detected output 534. In some embodiments, servo address mark detector circuit 536 is a Hamming detector which determines the Hamming distance between an expected servo address mark pattern and the data pattern in detected output 534. Based upon the disclosure provided herein, one of ordinary skill in the art will recognize a variety of servo address mark detector circuits that may be used in relation to different embodiments of the present invention. The region indicator output 540 of servo address mark detector circuit 536 provides an indication to flawscan circuit 530 of the servo region from which detected output 534 was read. In some embodiments, the region indicator output 540 of servo address mark detector circuit 536 differentiates between a preamble region, a servo address mark region, and a Gray code region, enabling the flawscan circuit 530 to count potential flaws in each of these three servo regions. In other embodiments, other region detectors are used in place of servo address mark detector circuit 536, with region indicator output 540 identifying other data regions of the storage medium.

Branch metrics 526 and detected output 528 from data detector 524, and region indicator output 540 are provided to flawscan detector 530, which selects among the branch metrics 526 based on the detected output 528, processes the selected branch metrics 526 to detect flaws on a storage medium from which the analog signal 502 was read or derived, and which yields a flaw indicator signal 532. Flaw indicator signal 532 is a count of the number of potential flaws detected by flawscan detector 530 in each of a number of regions of the storage medium, as specified by region indicator output 540.

Figure 6:
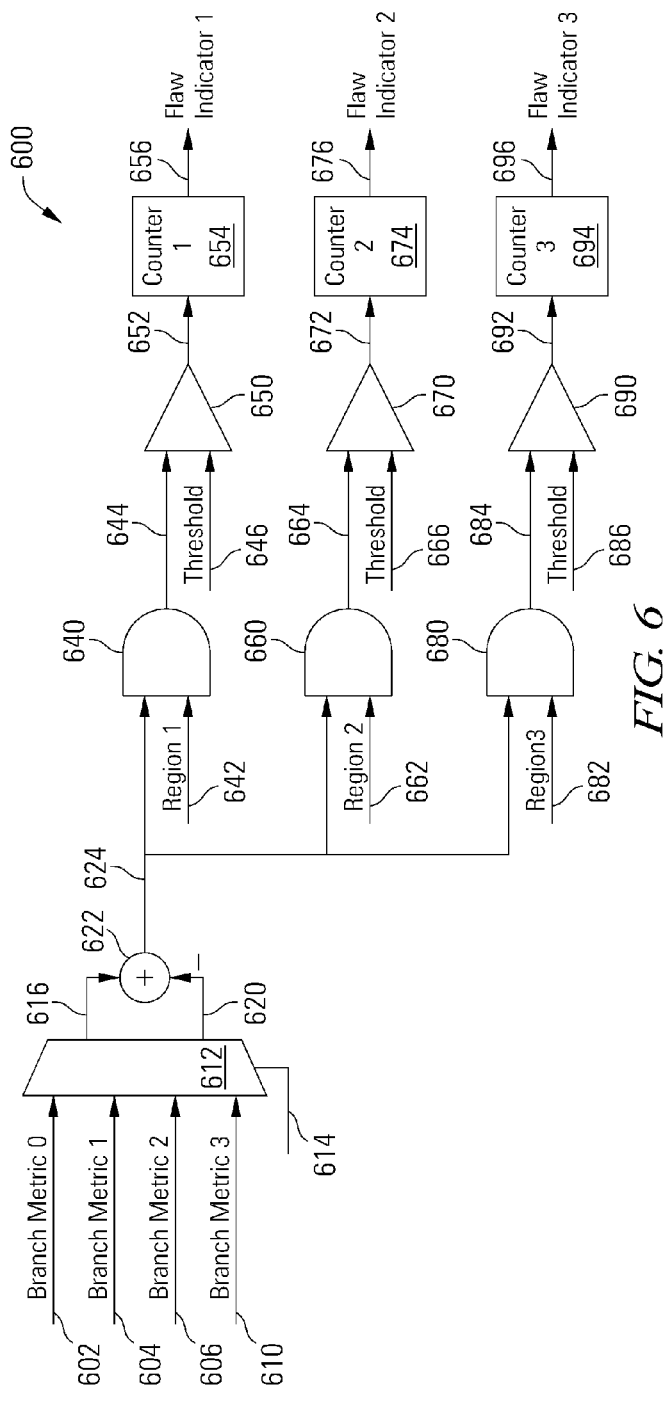
FIG. 6 depicts a block diagram of a flawscan circuit with region differentiation based on detector branch metrics in accordance with some embodiments of the present invention.

Turning now to FIG. 6, a flawscan circuit 600 with region differentiation based on detector branch metrics 602, 604, 606, 610 is disclosed in accordance with some embodiments of the present invention. In some embodiments, branch metrics 602-610 are Euclidean distances between interpolator output (e.g., 222, 522) and y ideal values, generated by a data detector during a data detection algorithm. Flawscan circuit 600 is not limited to use with a two-state data detector and four branch metrics, and other embodiments select between other numbers of branch metric inputs to yield a pair of branch metrics to compare and analyze.

The branch metrics 602-610 are provided to a four to two multiplexer 612 that accepts as inputs the four branch metrics 602-610 and yields two branch metric outputs 616, 620 based on a selector signal 614. Again, in other embodiments, other numbers of branch metric inputs are provided to the multiplexer to select a pair of branch metric outputs.

The selector signal 614 selects two of the branch metrics 602-610 to be compared and analyzed to detect flaws in a storage medium. In some embodiments, the first branch metric output 616 carries the branch metric value for a branch between an inverse detected data bit and a subsequent detected user data bit, and the second branch metric output 620 carries the branch metric value for a branch between two successive detected user data bits. In other embodiments, other pairs of branch metric values are selected.

The second branch metric output 620 is subtracted from the first branch metric output 616 in subtraction circuit 622, yielding difference 624. A region 1 signal 642 is used to enable analysis of difference 624 to increment a first counter 654 only when potential flaws are detected in a first region. For example, the difference 624 is combined in some embodiments with the region 1 signal 642 in AND gate 640 to yield region-differentiated difference 644. The region-differentiated difference 644 is compared with a threshold 646 in comparator circuit 650, yielding comparison 652 which is asserted when region-differentiated difference 644 is less than threshold 646. In some embodiments, threshold 646 is user programmable to set the level at which a branch metric difference indicates a potential flaw in the storage medium. The comparison 652 is provided to counter 654 which keeps a count of the number of potential flaws detected in the storage medium in the first region. When the region-differentiated difference 644 is less than the threshold 646, the counter 654 is incremented. The count from counter 654 is provided as a first region flaw indicator output 656.

A region 2 signal 662 is used to enable analysis of difference 624 to increment a second counter 674 only when potential flaws are detected in a second region. For example, the difference 624 is combined in some embodiments with the region 2 signal 662 in AND gate 660 to yield region-differentiated difference 664. The region-differentiated difference 664 is compared with a threshold 666 in comparator circuit 670, yielding comparison 672 which is asserted when region-differentiated difference 664 is less than threshold 666. In some embodiments, threshold 666 is user programmable to set the level at which a branch metric difference indicates a potential flaw in the storage medium. The comparison 672 is provided to counter 674 which keeps a count of the number of potential flaws detected in the storage medium in the second region. When the region-differentiated difference 664 is less than the threshold 666, the counter 674 is incremented. The count from counter 674 is provided as a second region flaw indicator output 676.

A region 3 signal 682 is used to enable analysis of difference 624 to increment a third counter 694 only when potential flaws are detected in a second region. For example, the difference 624 is combined in some embodiments with the region 3 signal 682 in AND gate 680 to yield region-differentiated difference 684. The region-differentiated difference 684 is compared with a threshold 686 in comparator circuit 690, yielding comparison 692 which is asserted when region-differentiated difference 684 is less than threshold 686. In some embodiments, threshold 686 is user programmable to set the level at which a branch metric difference indicates a potential flaw in the storage medium. The comparison 692 is provided to counter 694 which keeps a count of the number of potential flaws detected in the storage medium in the third region. When the region-differentiated difference 684 is less than the threshold 686, the counter 694 is incremented. The count from counter 694 is provided as a third region flaw indicator output 696.

The flawscan circuit 600 may be adapted to count potential flaws in any number of different regions of the storage medium, with thresholds 646, 666, 686 being either the same or different for different regions in various embodiments.

Figure 7:
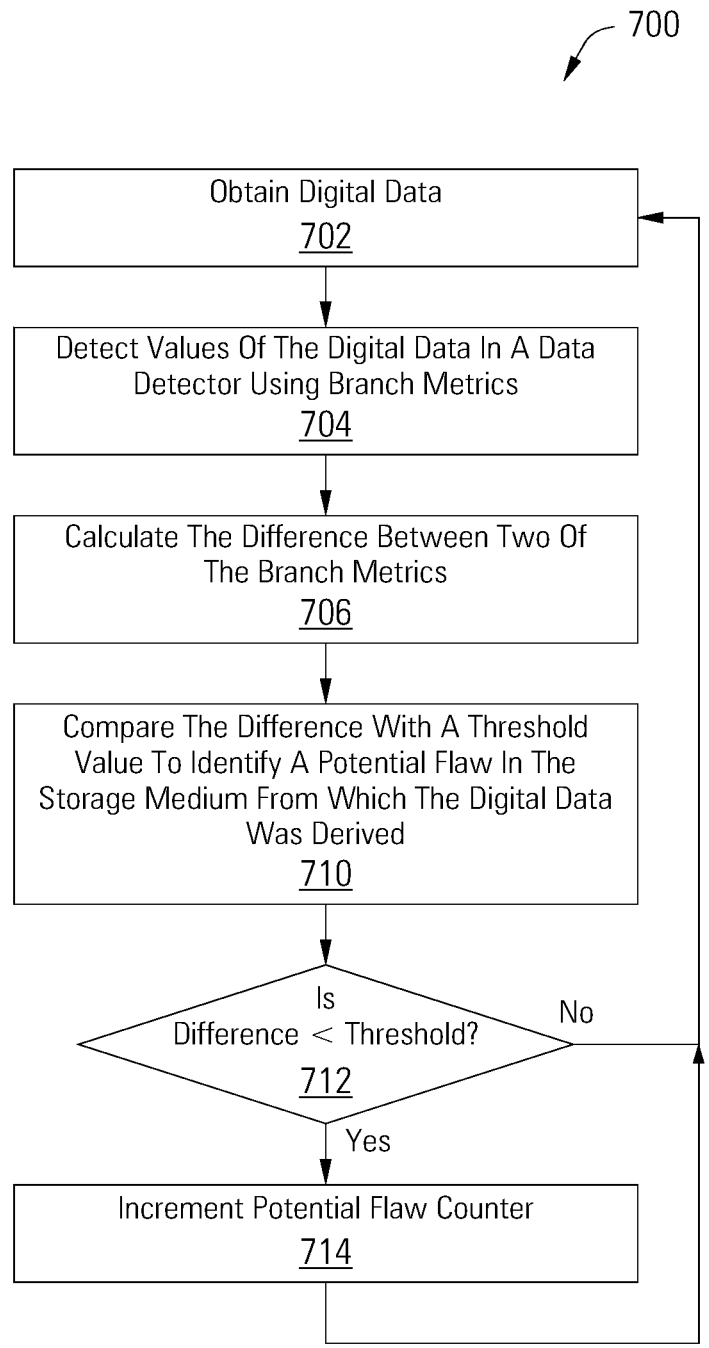
FIG. 7 depicts a flow diagram of an operation for detecting media flaws in a flawscan circuit based on detector branch metrics in accordance with some embodiments of the present invention.

Turning to FIG. 7, a flow diagram 700 depicts a method for detecting media flaws in a flawscan circuit based on detector branch metrics in accordance with some embodiments of the present invention. The method of FIG. 7, or variations thereof, may be performed in data processing systems and flawscan circuits such as those illustrated in FIGS. 2-6. Following flow diagram 700, digital data is obtained. (Block 702) The digital data is derived from a signal read from a storage medium such as a magnetic hard disk drive, and can be obtained, for example, by processing an analog signal, sampling the analog signal in an analog to digital converted, filtering the resulting digital samples, etc. Values of the digital data are detected in a data detector using branch metrics. (Block 704) The difference between two of the branch metrics is calculated. (Block 706) In some embodiments, the two branch metrics are selected from a number of available branch metrics and include a branch metric for a "from branch" and a branch metric for a "decision branch". This difference is calculated in some embodiments for each successive bit in the digital data, based on branch metrics between decision states for the bit and the preceding bit. The difference is compared with a threshold value to identify a potential flaw in the storage medium from which the digital data was derived. (Block 710) The threshold established the detection sensitivity for flaws, and in some embodiments, is user programmable. A determination is made as to whether the difference is less than the threshold. (Block 712) If so, a potential flaw counter is incremented. (Block 714) The process then continues with the next bit of the digital data. (Block 702)

Figure 8:
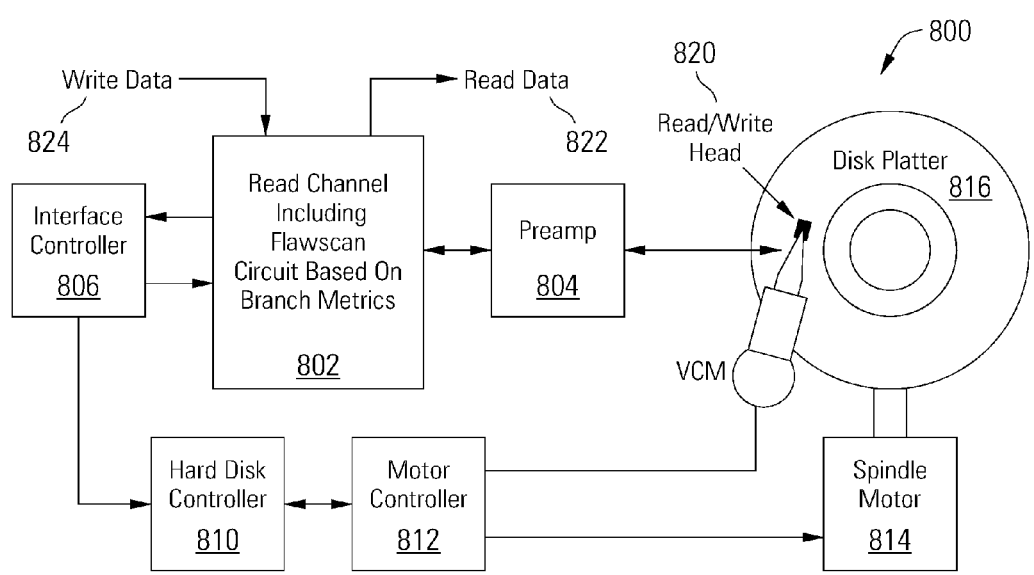
FIG. 8 depicts a storage system including a data processing circuit with a flawscan circuit based on detector branch metrics in accordance with some embodiments of the present invention.

Turning to FIG. 8, a storage system 800 is shown in accordance with some embodiments of the present invention. The storage system 800 includes a read channel circuit 802 (or servo channel circuit) with a flawscan circuit based on detector branch metrics in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. Either as a factory process during manufacturing, or as part of processing the received information, read channel circuit 802 analyzes the received signal using a flawscan circuit based on detector branch metrics. Such a flawscan circuit based on detector branch metrics may be implemented consistent with the disclosure above in relation to FIGS. 2-6. In some cases, the flaw detection may be performed consistent with the flow diagram disclosed above in relation to FIG. 7. A write operation is substantially the opposite of the preceding read operation with write data 824 being provided to read channel circuit 802 and written to disk platter 816.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for a flawscan circuit based on branch metrics from a digital data detector. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for detecting media flaws, comprising:
   a branch metric selection circuit operable to select as a first branch metric a branch metric value for a branch between a previous decision state and a subsequent non-decision state, and as a second branch metric a branch metric value for a branch between two successive decision states;
   a subtraction circuit operable to subtract the second branch metric from the first branch metric to yield a difference;
   a comparator operable to compare the difference with a threshold value and to indicate a presence of a potential flaw in a storage medium when the difference is less than the threshold value.

2. The apparatus of claim 1, further comprising a counter operable to count the potential flaws indicated by the comparator.

3. The apparatus of claim 1, further comprising a storage medium region input and a plurality of counters operable to count the potential flaws indicated by the comparator in each of a plurality of different regions of the storage medium.

4. The apparatus of claim 3, further comprising a servo address mark detection circuit operable to identify the plurality of different regions via the storage medium region input.

5. The apparatus of claim 1, wherein the threshold value is programmable.

6. The apparatus of claim 1, wherein the branch metric selection circuit comprises a multiplexer.

7. The apparatus of claim 1, wherein the branch metric values are generated in a data detector during a data detection operation for determining values of digital data.

8. The apparatus of claim 1, further comprising a data detector operable to provide the first branch metric and the second branch metric for each of a plurality of data bits during a data detection operation.

9. The apparatus of claim 8, wherein the data detector comprises a Viterbi detector operable to perform a detection algorithm on wide bi-phase encoded user data.

10. The apparatus of claim 1, wherein the apparatus is implemented as an integrated circuit.

11. The apparatus of claim 1, wherein the apparatus is incorporated in a magnetic storage device and is operable to detect flaws on the storage medium in the magnetic storage device.

12. The apparatus of claim 1, wherein the apparatus is incorporated in a storage system comprising a redundant array of independent disks.

13. A method of detecting media flaws, comprising:
    obtaining a first branch metric and a second branch metric, wherein the first branch metric comprises a branch metric value for a branch between a previous decision state and a subsequent non-decision state, and wherein the second branch metric comprises a branch metric value for a branch between two successive decision states;
    subtracting the second branch metric from the first branch metric to yield a difference;
    comparing the difference with a threshold; and
    identifying a potential media flaw when the difference is less than the threshold.

14. The method of claim 13, further comprising performing a data detection algorithm to detect correct values of digital data, wherein the first branch metric and the second branch metric are generated during the data detection algorithm.

15. The method of claim 14, wherein the data detection algorithm comprises a Viterbi algorithm.

16. The method of claim 13, further comprising counting the potential media flaws.

17. The method of claim 16, further comprising differentiating the counting of the potential media flaws for each of a plurality of different regions of a storage medium.

18. The method of claim 17, further comprising detecting a plurality of different servo fields in a servo wedge of a magnetic storage medium, wherein the counting of the potential media flaws is differentiated for the different servo fields.

19. A storage system comprising:
  a storage medium;
  a read/write head assembly operable to read data on the storage medium;
  a digital data detector operable to detect values of the data; and
  a flawscan circuit operable to detect potential flaws on the storage medium based at least in part on a branch metric difference from the digital data detector, wherein the branch metric difference comprises a difference between a first branch metric value for a branch between a previous decision state and a subsequent non-decision state, and a second branch metric value for a branch between two successive decision states.

20. The storage system of claim 19, wherein the flawscan circuit is operable to count the potential flaws in each of a plurality of different regions of the storage medium identified by a servo address mark detection circuit.

\* \* \* \* \*